United States Patent
Hung et al.

(10) Patent No.: US 9,882,096 B2
(45) Date of Patent: Jan. 30, 2018

(54) LIGHT EMITTING DIODE STRUCTURE AND METHOD FOR MANUFACTURING THE SAME

(71) Applicant: Genesis Photonics Inc., Tainan (TW)

(72) Inventors: Cheng-Wei Hung, Tainan (TW); Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/073,715

(22) Filed: Mar. 18, 2016

(65) Prior Publication Data

US 2016/0276547 A1    Sep. 22, 2016

Related U.S. Application Data

(60) Provisional application No. 62/134,577, filed on Mar. 18, 2015.

(30) Foreign Application Priority Data

Aug. 4, 2015    (TW) .............................. 104125226 A

(51) Int. Cl.
*H01L 33/38*    (2010.01)
*H01L 33/50*    (2010.01)
(Continued)

(52) U.S. Cl.
CPC .......... *H01L 33/502* (2013.01); *H01L 27/156* (2013.01); *H01L 33/0095* (2013.01);
(Continued)

(58) Field of Classification Search
CPC ....... H01L 33/382; H01L 33/50; H01L 33/52; H01L 33/502
See application file for complete search history.

(56) References Cited

U.S. PATENT DOCUMENTS 7,810,956 B2    10/2010   Bierhuizen et al.
8,399,275 B2    3/2013    Akimoto et al.
(Continued)

FOREIGN PATENT DOCUMENTS

CN    102468417 A    5/2012
JP    2011114093 A    6/2011
(Continued)

OTHER PUBLICATIONS

Non-Final Office Action issued in U.S. Appl. No. 15/073,672, filed Mar. 18, 2016, dated Mar. 10, 2017.
(Continued)

*Primary Examiner* — Phat X Cao
(74) *Attorney, Agent, or Firm* — McClure, Qualey & Rodack, LLP

(57)    ABSTRACT

An edge lighting light emitting diode (LED) structure and a method of manufacturing the same are provided. The edge lighting LED structure includes a substrate, an electrode pattern, a chip, an encapsulation layer and a fluorescent layer. The electrode pattern at least includes two first conducting portions separately disposed on an upper surface of the substrate, two second conducting portions separately disposed on a lower surface of the substrate, and two conducting holes separately vertically penetrating through the substrate, each conducting hole connects a first conducting portion and a second conducting portion, and the conducting holes are exposed on a lateral surface of the substrate. A second surface of the chip is disposed on the first conducting portions. A top surface of the encapsulation layer exposes and is aligned with the first surface of the chip. The fluorescent layer covers a first surface of the chip.

10 Claims, 5 Drawing Sheets

(51) Int. Cl.
   *H01L 33/56*   (2010.01)
   *H01L 33/40*   (2010.01)
   *H01L 33/00*   (2010.01)
   *H01L 27/15*   (2006.01)
   *H01L 33/52*   (2010.01)

(52) U.S. Cl.
   CPC ............ *H01L 33/385* (2013.01); *H01L 33/40* (2013.01); *H01L 33/50* (2013.01); *H01L 33/52* (2013.01); *H01L 33/56* (2013.01); *H01L 33/382* (2013.01); *H01L 33/505* (2013.01); *H01L 2933/005* (2013.01); *H01L 2933/0016* (2013.01); *H01L 2933/0041* (2013.01); *H01L 2933/0066* (2013.01)

(56) References Cited

U.S. PATENT DOCUMENTS

| | | | |
|---|---|---|---|
| 8,461,607 | B2 | 6/2013 | Tsang |
| 8,860,061 | B2 | 10/2014 | Kotani |
| 8,890,188 | B2 | 11/2014 | Park et al. |
| 9,419,189 | B1 | 8/2016 | David et al. |
| 2004/0119402 | A1 | 6/2004 | Shiang et al. |
| 2007/0236940 | A1 | 10/2007 | Kuroda et al. |
| 2008/0123024 | A1 | 5/2008 | Han et al. |
| 2008/0246902 | A1 | 10/2008 | Cheng |
| 2009/0296389 | A1 | 12/2009 | Hsu |
| 2010/0052001 | A1* | 3/2010 | Li ............... H01L 25/0753 257/98 |
| 2010/0066236 | A1 | 3/2010 | Xu et al. |
| 2010/0117530 | A1 | 5/2010 | Lin et al. |
| 2010/0258830 | A1 | 10/2010 | Ide et al. |
| 2011/0001157 | A1 | 1/2011 | McKenzie et al. |
| 2011/0102883 | A1 | 5/2011 | Narendran et al. |
| 2011/0198780 | A1 | 8/2011 | Basin et al. |
| 2012/0025218 | A1 | 2/2012 | Ito et al. |
| 2012/0061700 | A1 | 3/2012 | Eder et al. |
| 2012/0077292 | A1* | 3/2012 | Chang ............ B29C 31/045 438/27 |
| 2012/0161164 | A1 | 6/2012 | Kim |
| 2012/0181569 | A1 | 7/2012 | Choi |
| 2012/0235126 | A1 | 9/2012 | Yamazaki et al. |
| 2012/0236582 | A1 | 9/2012 | Waragaya et al. |
| 2012/0250320 | A1 | 10/2012 | Harbers et al. |
| 2013/0015483 | A1 | 1/2013 | Shimokawa et al. |
| 2013/0094177 | A1 | 4/2013 | Edwards |
| 2013/0194794 | A1 | 8/2013 | Kim |
| 2013/0207141 | A1 | 8/2013 | Reiherzer |
| 2013/0207142 | A1 | 8/2013 | Reiherzer |
| 2014/0021493 | A1 | 1/2014 | Andrews et al. |
| 2014/0054621 | A1 | 2/2014 | Seko |
| 2014/0117396 | A1 | 5/2014 | Eisert et al. |
| 2014/0124812 | A1 | 5/2014 | Kuramoto et al. |
| 2014/0153238 | A1 | 6/2014 | Nishimura et al. |
| 2014/0186979 | A1 | 7/2014 | Tu et al. |
| 2014/0203451 | A1 | 7/2014 | Kwon et al. |
| 2014/0252389 | A1 | 9/2014 | Koizumi et al. |
| 2015/0102373 | A1 | 4/2015 | Lee et al. |
| 2015/0179901 | A1 | 6/2015 | Ok et al. |
| 2015/0200338 | A1 | 7/2015 | Kim et al. |
| 2015/0280078 | A1 | 10/2015 | Yen et al. |
| 2016/0155915 | A1 | 6/2016 | Ling et al. |
| 2016/0181476 | A1 | 6/2016 | Chang et al. |

FOREIGN PATENT DOCUMENTS

| | | |
|---|---|---|
| TW | 200841089 | 10/2008 |
| TW | 200929615 A | 7/2009 |
| TW | 201218428 A | 5/2012 |
| TW | 201220560 A | 5/2012 |
| TW | 201308691 A | 2/2013 |
| TW | 201319460 A1 | 5/2013 |
| TW | 201507209 A | 2/2015 |

OTHER PUBLICATIONS

TIPO Office Action dated Dec. 22, 2016 in Taiwan application (No. 105126842).
Non-Final Office Action issued in U.S. Appl. No. 14/462,581, filed Aug. 19, 2014, dated Aug. 20, 2015.
Non-Final Office Action issued in U.S. Appl. No. 15/073,673, filed Mar. 18, 2016, dated Mar. 31, 2017.
Non-Final Office Action issued in U.S. Appl. No. 15/168,218, filed May 30, 2016, dated Nov. 4, 2016.
Non-Final Office Action issued in U.S. Appl. No. 15/073,707, filed Mar. 18, 2016, dated May 1, 2017.
Non-Final Office Action issued in U.S. Appl. No. 15/268,681, filed Sep. 19, 2016, dated Feb. 7, 2017.
TW Office Action dated Nov. 17, 2016 in Taiwan application (No. 104144809).
U.S. Appl. No. 15/073,707, filed Sep. 29, 2016.
U.S. Appl. No. 15/073,672, filed Sep. 22, 2016.
U.S. Appl. No. 15/268,654, filed Jan. 5, 2017.
U.S. Appl. No. 15/073,673, filed Sep. 22, 2016.
Non-Final Office Action issued in U.S. Appl. No. 15/045,471, filed Feb. 17, 2016, dated Oct. 25, 2016.
Non-Final Office Action issued in U.S. Appl. No. 14/711,798, filed May 14, 2015, dated Dec. 16, 2016.
Office Action issued in corresponding China patent application dated May 22, 2017.
Non-Final Office Action issued in U.S. Appl. No. 15/268,654, filed Sep. 19, 2016, dated Jun. 15, 2017.
Final Office Action issued in U.S. Appl. No. 14/711,798, filed May 14, 2015, dated Jul. 28, 2017.
CN Office Action dated Nov. 14, 2017 in Chinese application (No. 201410362787.6).

\* cited by examiner

LIGHT EMITTING DIODE STRUCTURE AND METHOD FOR MANUFACTURING THE SAME

This application claims the benefits of U.S. Provisional Application No. 62/134,577, filed on Mar. 18, 2015, and Taiwan Application No. 104125226, filed on Aug. 4, 2015. The disclosures of which are incorporated by reference herein in their entirety.

TECHNICAL FIELD

The disclosure relates to a light emitting diode (LED) and a method for manufacturing the same.

BACKGROUND

LEDs are energy-efficient and environmentally friendly, and are used in a wide range of applications. The LEDs are not only disposed in products in daily life such as general lighting, displays of computers or portable electronic devices, billboards, works of art and applications thereof, but also used in some particular semiconductor processes as the lights sources. For example, ultraviolet (UV) LEDs are used in ultraviolet exposure machine and the manufacture of UV light panels.

Generally, a LED chip is disposed on a ceramic or metal substrate, and the LED chip is packaged and encapsulated by an encapsulation material to form a package structure, so as to prevent the aging of the chip caused by the direct exposure in the air atmosphere. According to the relative location between a light emitting surface and an installation surface, which is connected to an external component, after a package structure of a LED chip is electrically connected to the external component, the LED structures can be dived into two types, one is direct lighting LED structure of which the light emitting surface and the installation surface are positioned oppositely, and the other one is edge lighting LED structure of which the light emitting surface and the installation surface are, for example, perpendicular to each other. Whatever the structure is, it is desired to develop a unit structure that exhibits a maintained or improved product yield and electrical performance, and has a good alignment precision and assembly efficiency when it is bounded with an external component. Further, it is preferred that the structure can be manufactured by a method having simple steps and being suitable for mass production.

SUMMARY

The disclosure relates to a LED and a method for manufacturing the same. With the design of the embodiments, a LED unit structure can have an electrode pattern that is exposed on a lateral surface of the substrate, such as conducting holes forming continuous conducting junctions.

A LED is provided. The LED comprises a substrate, an electrode pattern, a chip, an encapsulation layer and a fluorescent layer. The substrate has an upper surface and a lower surface positioned oppositely, and a lateral surface connecting the upper surface and the lower surface. The electrode pattern at least comprises: two first conducting portions separately disposed on the upper surface of the substrate; two second conducting portions separately disposed on the lower surface of the substrate; and two conducting holes separately penetrating through the substrate, wherein each of the conducting holes connects one of the first conducting portions and one of the second conducting portions, and the conducting holes are exposed on the lateral surface of the substrate. The chip has a first surface and a second surface positioned oppositely, wherein the second surface of the chip is disposed on the two first conducting portions. The encapsulation layer covers the upper surface of the substrate, and the encapsulation layer encapsulates the chip and exposes the first surface of the chip. The fluorescent layer is disposed on the first surface of the chip.

A method for manufacturing a LED is provided. The method comprises the following steps. A substrate is provided, wherein the substrate has an upper surface and a lower surface positioned oppositely, and the substrate comprises a plurality of unit regions. An electrode pattern is formed at the substrate, wherein, corresponding to each of the unit regions, the electrode pattern at least comprises: two first conducting portions separately disposed on the upper surface of the substrate; two second conducting portions separately disposed on the lower surface of the substrate; and two conducting holes separately penetrating through the substrate, wherein each of the conducting holes connects one of the first conducting portions and one of the second conducting portions. A plurality of chips are separately disposed on the upper surface of the substrate, wherein each chip in each of the unit regions has a first surface and a second surface positioned oppositely, and the second surface of the chip is disposed on the two first conducting portions. An encapsulating material is formed on the upper surface of the substrate, wherein a top surface of the encapsulation layer exposes the first surfaces of the chips. A fluorescent material is coated on the first surface of the chip in each of the unit regions. The encapsulation layer, the conducting holes and the substrate are diced to form a plurality of LEDs which are separated from each other, wherein the conducting holes of each of the LEDs have junctions extend from the first conducting portions to the second conducting portions, the junctions are exposed on a lateral surface of the substrate which connects the upper surface and the lower surface, and the junctions are aligned with the lateral surface.

Figure 1:
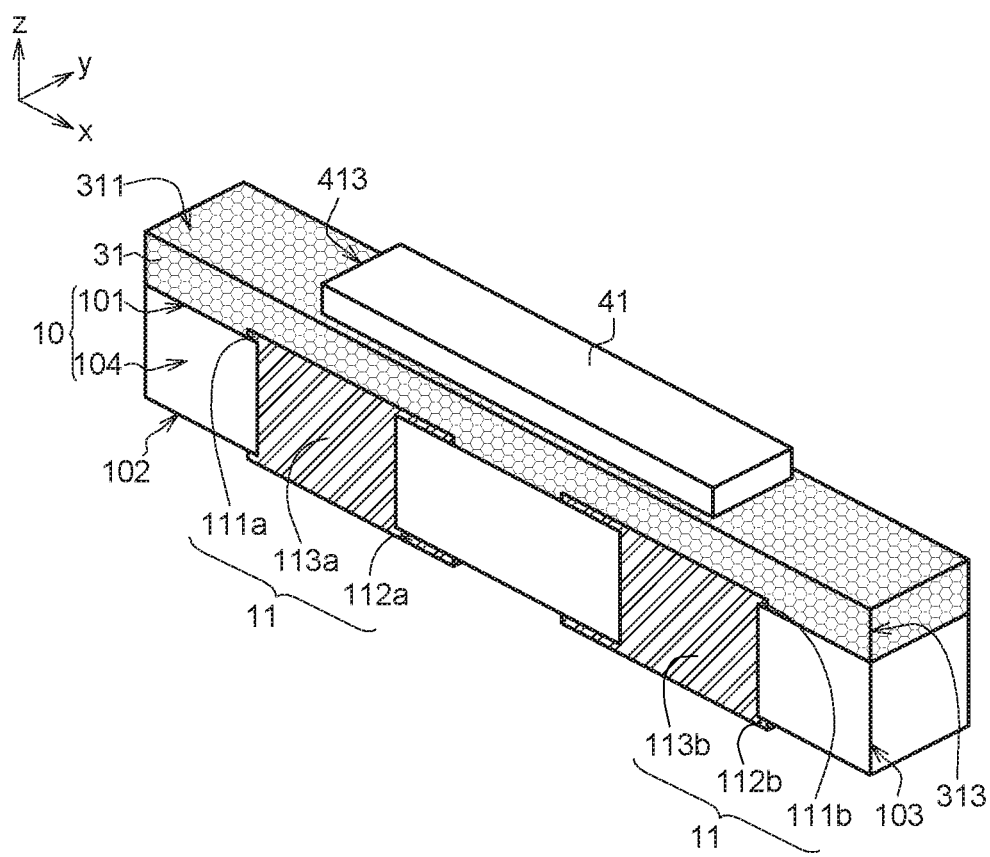
FIG. 1 illustrates a unit structure of an edge lighting LED chip according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments provide a LED, in particular but not limited to an edge lighting LED and a method for manufacturing the same. The implementation will be described in detail with the appended drawings in the following description. It is to be noted that the structure and the description provided in the embodiments are provided for exemplary explanation only, and the scope of the disclosure is not limited thereto. In the embodiments, the same or similar reference numerals are used for the same or similar elements. It is to be noted that not all the possible embodiments are provided in the disclosure. Various modifications and variations for the structure can be made as needed without departing the spirit and the scope of the disclosure. As such, the implementation not disclosed herein may also be applicable. Further, the drawings are simplified for clarity, and the sizes and ratios of the elements shown in the figures are not illustrated according the ratios of real products. As such, the illustration of the specification and the drawings is provided for the description of embodiments only, and will not limit the scope of the disclosure.

Figure 2:
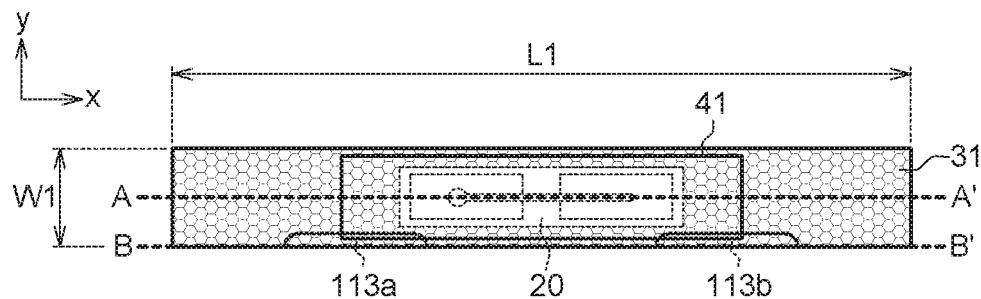
FIG. 2 shows a top view of the edge lighting LED chip of FIG. 1.
Figure 3:
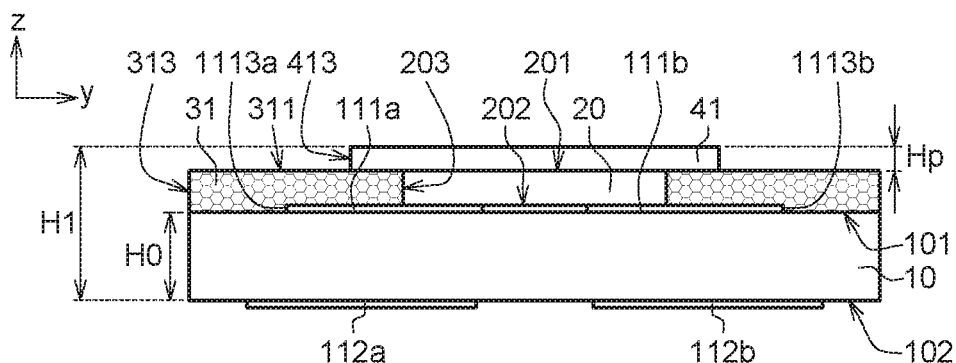
FIG. 3 shows a cross-sectional view of the edge lighting LED chip along the A-A' line in FIG. 2.
Figure 4:
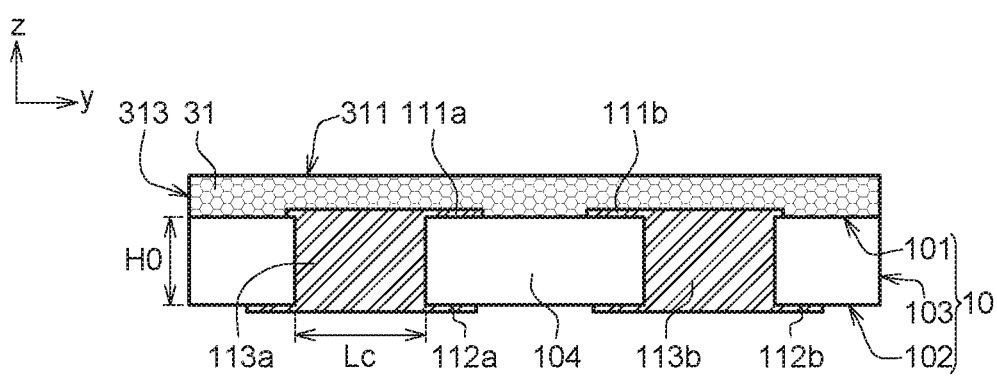
FIG. 4 shows a cross-sectional view of the edge lighting LED chip along the B-B' line in FIG. 2.

FIG. 1 illustrates a unit structure of an edge lighting LED chip of one embodiment of the disclosure. FIG. 2 shows a top view of the edge lighting LED chip of FIG. 1. FIG. 3 shows a cross-sectional view of the edge lighting LED chip along the A-A' line in FIG. 2. FIG. 4 shows a cross-sectional view of the edge lighting LED chip along the B-B' line in FIG. 2. Please refer to FIGS. 1-4.

The edge lighting LED 1 comprises a substrate 10, an electrode pattern 11, a chip 20, an encapsulation layer 31 and a fluorescent layer 41. The substrate 10 has an upper surface 101 and a lower surface 102 positioned oppositely, and a lateral surface 104 connecting the upper surface 101 and the lower surface 102. Conducting traces are formed on the upper surface 101 and the lower surface 102 of the substrate 10, respectively, and conducting holes which can connect the upper and lower surfaces are formed. As shown in FIG. 1 and FIG. 4, the electrode pattern 11 at least comprises two first conducting portions 111a and 111b separately disposed on the upper surface 101 of the substrate 10, two second conducting portions 112a and 112b separately disposed on the lower surface 102 of the substrate 10, and two conducting holes 113a and 113b separately vertically penetrating through the substrate 10, wherein each of the conducting holes connects one of the first conducting portions and one of the second conducting portions, for example, the conducting hole 113a connects the first conducting portion 111a and the second conducting portion 112a, and the conducting hole 113b connects the first conducting portion 111b and the second conducting portion 112b.

Further, junctions of the conducting holes are exposed on the lateral surface 104 of the substrate 10. As shown in FIG. 1 and FIG. 4, the junction of the conducting hole 113a/113b extends from the first conducting portion 111a/111b to the second conducting portion 112a/112b and is exposed on the lateral surface 104 of the substrate 10, and the junction of the conducting hole 113a/113b is aligned with the lateral surface 104. In one embodiment, the material filled in the conducting hole 113a/113b is selected as, for example, but not limited to, the same material of first and second trace patterns (such as the first conducting portions 111a and 111b, and the second conducting portions 112a and 112b), as shown in FIG. 1 and FIG. 4. Further, in one embodiment, a length of the second conducting portion 112a/112b is larger than a length of the first conducting portion 111a/111b, but the disclosure is not limited thereto.

The chip 20 has a first surface 201 and a second surface 202 positioned oppositely, and the second surface 202 of the chip 20 is disposed on (across) the two first conducting portions 111a and 111b, as shown in FIG. 2 and FIG. 3. The first surface 201 is the light emitting surface of the chip 20. In one embodiment, an extending direction of the first surface 201 of the chip 20 (such as parallel to the x-y plane) is substantially perpendicular to an extending direction of the junction of the conducting hole 113a/113b (such as parallel to the y-z plane).

The encapsulation layer 31 covers the upper surface 101 of the substrate 10 and encapsulates the chip 20, a top surface 311 of the encapsulation layer 31 exposes the first surface 201 of the chip 20 and is aligned with the first surface 201 of the chip 20, as shown in FIG. 3. The encapsulating material of the encapsulation layer 31 has a reflectivity at least larger than 90%. In one embodiment, the material used as the encapsulating material is, for example, a polymer material, such as an epoxy resin or a silicone resin of white color, but not limited thereto. Such material has the characteristic of high reflectivity and thus can shield the side light, and thereby the forward light efficiency of the chip 20 can be improved.

The fluorescent layer 41 is disposed on the top surface 311 of the encapsulation layer 31 and covers the first surface 201 of the chip 20. In the embodiment, the fluorescent layer 41 directly contacts and at least completely covers the first surface 201 of the chip 20. In one embodiment, an area of the fluorescent layer 41 is larger than an area of the chip 20 and smaller than an area of the top surface 311 of the encapsulation layer 31, as shown in FIG. 2 and FIG. 3, and two second side surfaces 413 of the fluorescent layer 41 are correspondingly between two first side surfaces 213 of the chip 20 and two outer edges 1113a and 1113b of the first conducting portions 111a and 111b. In the manufacturing process, a mask with a plurality of separately disposed openings may be used, and the fluorescent material is coated through the openings to form the fluorescent layer 41 having a suitable area on the chip 20.

When the edge lighting LED 1 is real in use, it can be electrically connected to an external component through the junctions of the conducting holes 113a and 113b exposed on the lateral surface 104 of the substrate 10. Since the junctions of the conducting holes 113a and 113b are substantially perpendicular to the first surface 201 of the chip 20 (the light emitting surface), when the junctions of the conducting holes 113a and 113b of the LED are disposed on the external component, an edge lighting source can be provided. For example, the edge lighting LED 1 can be disposed at a side of a light guide plate (the side of the light incident surface), the first surface 201 of the chip 20 (the light emitting surface) provides the light toward the side of the light guide plate, and the junctions of the conducting holes 113a and 113b are disposed on and electrically connected to a circuit board.

In the embodiment, the junctions of the conducting holes 113a and 113b exposed on the lateral surface 104 of the substrate 10 can be electrically connected to an external component through, for example, solders. Areas of the junctions of the conducting holes 113a and 113b are the areas with which the solders can contact. Compared to a conventional LED, according to the design of the embodiments, the contact area electrically connected with the external component can be increased by adjusting the areas of the junctions of the conducting holes 113a and 113b exposed on the lateral surface 104 of the substrate 10 as needed, such as increasing the length Lc of the conducting hole 113a/113b (FIG. 4).

A group of the design sizes of the edge lighting LED 1 is as follows: the length L1 of the top surface 311 of the encapsulation layer 31 is 3.0 mm, the width W1 of the top surface 311 of the encapsulation layer 31 is 0.4 mm (FIG. 2), the thickness H0 of the substrate 10 is 0.38 mm, the thickness Hp of the fluorescent layer 41 is 0.10 mm, the thickness H1 from the top surface of the fluorescent layer 41 to the lower surface 102 of the substrate 10 is 0.69 mm (FIG. 3), and the length Lc of the conducting hole 113a/113b is 0.57 mm (FIG. 4). If the edge lighting LED 1 is electrically connected to an external component through solders when real in use, the area of the junction of the conducting hole 113a/113b exposed on the lateral surface 104 of the substrate 10 is the area with which a solder can contact, such as 0.38 mm*0.57 mm=0.217 mm². Of course, as known in the art, these values are provided for exemplary explanation only, the ranges of the disclosure are not limited thereto, and the real sizes can be appropriately modified and changed according to the application conditions.

Figure 5A:
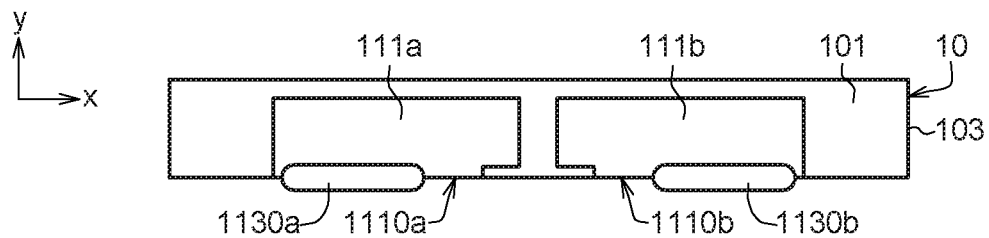
FIGS. 5A-5F illustrate a method for manufacturing an edge lighting LED of one embodiment of the disclosure.

FIGS. 5A-5F illustrate a method for manufacturing an edge lighting LED of one embodiment of the disclosure. FIG. 6 illustrates the matrix arrangement of the electrode patterns of a plurality of LEDs and the locations of the corresponding cutting lines in two axial directions in one embodiment of the disclosure. In FIGS. 5A-5F, the cross-sectional views of a single LED are used for the illustration of the manufacturing method, such that the details can be clearly shown and described, and the relative locations of the unit regions of a plurality of LEDs on the substrate and the cutting lines can be arranged with reference to FIG. 6. FIG. 6 illustrates cutting lines in two axial directions, such as first cutting lines Cx along a first cutting direction D1 and second cutting lines Cy along a second cutting direction D2, and the cutting lines Cx and Cy have a certain width. Further, regarding the portions that are not shown in FIGS. 5A-5F and FIG. 6 due to the limitation of the viewing angle, such as surfaces, side surfaces, or the like, please refer to the detailed description above with respect to FIGS. 1-4.

First, a substrate 10 is provided, the substrate 10 has an upper surface 101 and a lower surface 102 positioned oppositely, and the substrate 10 comprises a plurality of unit regions Ur. Further, an electrode pattern 11 is formed at the substrate 10. As shown in FIG. 5A and FIG. 6, corresponding to each unit region Ur, the electrode pattern 11 at least comprises: two first conducting portions 111a and 111b separately disposed on the upper surface 101 of the substrate 10, two second conducting portions 112a and 112b separately disposed on the lower surface 102 of the substrate 10, and two conducting holes 1130a and 1130b separately vertically penetrating through the substrate 10, wherein the conducting holes 1130a and 1130b connect the first conducting portions 111a and 111b as well as the second conducting portions 112a and 112b, respectively.

In one embodiment, a ceramic substrate 10 having a low coefficient of thermal expansion (CTE) value is exemplarily selected. A first trace pattern and a second trace pattern are disposed on the upper surface and the lower surface of the ceramic substrate, respectively, and holes are drilled by the laser such that a conducting material such as metal can be plated or directly filled therein. Thereby, the conducting holes 1130a and 1130b penetrating the substrate 10 and connecting the upper and lower traces are formed. The conducting holes 1130a and 1130b are formed by forming through holes using laser drilling followed by filling the conducting material into the through holes. The conducting material is, for example, a single metal or a composite metal comprising two or more metals, as long as it can be the filler for the through holes. In one embodiment, the conducting material comprises at least one of gold, silver, and copper. The filling method and material for the conducting holes 1130a and 1130b are not limited in the disclosure. In one embodiment, the material filled in the conducting holes 1130a and 1130b are selected as the same material of the first and second trace patterns (such as the first conducting portions 111a and 111b, and the second conducting portions 112a and 112b). Further, for distinction, in the embodiment, the conducting holes before dicing are indicated as 1130a/1130b, and the conducting holes of each unit after dicing are indicated as 113a/113b.

Figure 5B:
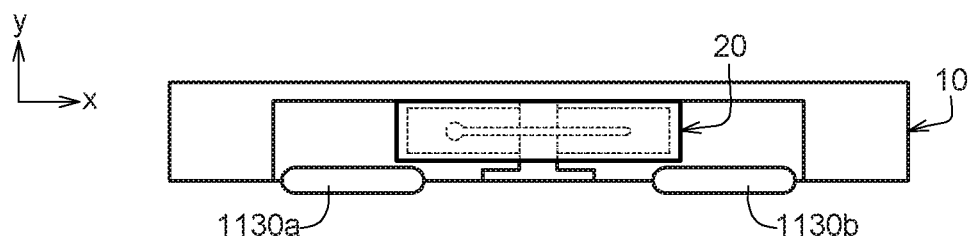
Figure 6:
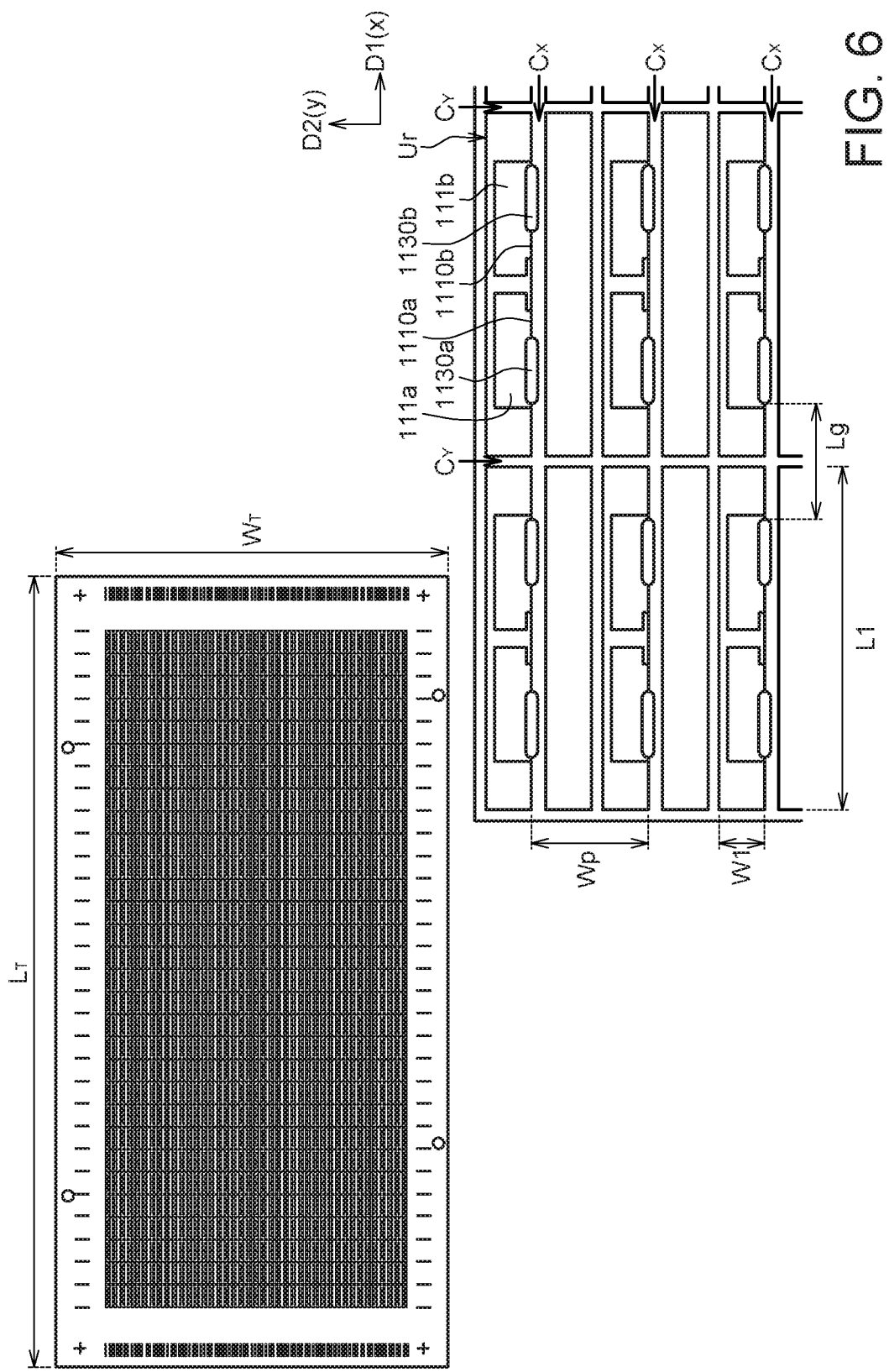
FIG. 6 illustrates the matrix arrangement of the electrode patterns of a plurality of LEDs and the locations of the corresponding cutting lines in two axial directions in one embodiment of the disclosure.

As shown in FIG. 5B, a plurality of chips 20 are separately disposed on the upper surface 101 of the substrate 10, wherein each chip 20 in each unit region Ur has a first surface 201 (the light emitting surface) and a second surface 202 positioned oppositely, and the second surface 202 of the chips 20 is disposed on the two first conducting portions 111a and 111b. In the embodiment, the chips 20 has, for example, a flip-chip configuration, and it is disposed on the trace pattern through a flip attachment, such as across the first conducting portions 111a and 111b.

Figure 5C:
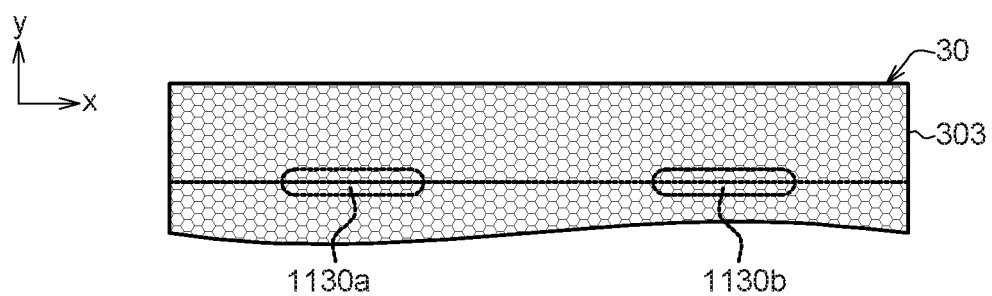

As shown in FIG. 5C, an encapsulating material 30 is formed on the upper surface 101 of the substrate 10, and the encapsulating material 30 covers the upper surface 101 of the substrate 10, the chips 20, and the conducting holes 1130a and 1130b. In the embodiment, the encapsulating material 30 is, for example, a white epoxy or silicone resin. In one embodiment, the chips 20 and the upper surface 101 of the substrate 10 are encapsulated such as by pressure molding the silicone resin.

Figure 5D:
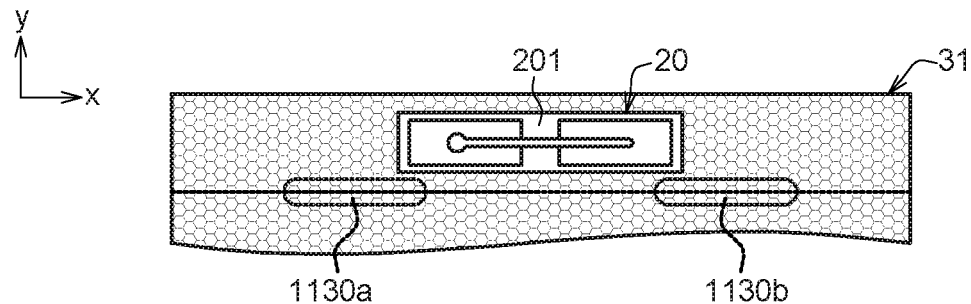

As shown in FIG. 5D, a portion of the encapsulating material 30 is removed to form an encapsulation layer 31, and a top surface 311 of the encapsulation layer 31 exposes the first surfaces 201 of the chips 20 and is aligned with the first surfaces 201 of the chips 20. In one embodiment, the portion of the encapsulating material 30 is removed such as by polishing to expose the first surfaces 201 of the chips 20.

Figure 5E:
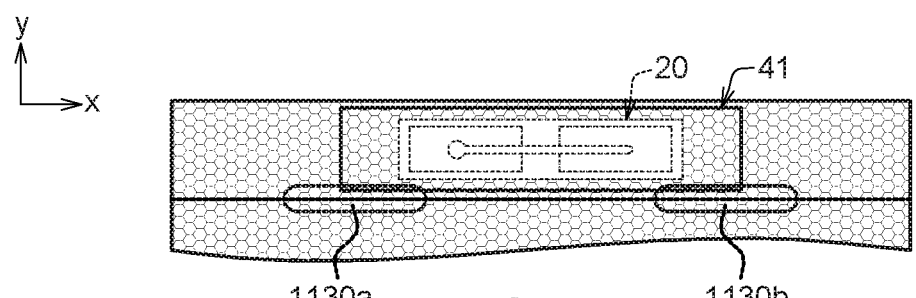

As shown in FIG. 5E, a fluorescent material 40 is coated on the top surface 311 of the encapsulation layer 31 to form, in a suitable region of each unit region Ur, a fluorescent layer 41, wherein the fluorescent layer 41 at least covers the first surface 201 of the chips 20. In the embodiment, the step of coating the fluorescent material 40 exemplarily comprises: providing a mask (not shown) above the encapsulation layer, wherein the mask has a plurality of openings which are separated from each other, and the openings correspond to the locations of the chips 20, respectively; and coating (such as spraying) the fluorescent material 40 on the top surface 311 of the encapsulation layer 31 through the openings of the mask to form the fluorescent layer 41 at least completely covering the first surface 201 of the chips 20. In one embodiment, areas of the openings of the mask are larger than areas of the chips 20. In one embodiment, the fluorescent layer 41 directly contacts the first surface 201 of the chips 20. Further, in one embodiment, in each LED formed after dicing, an area of the fluorescent layer 41 is larger than the area of the chip 20 and smaller than an area of the top surface 311 of the encapsulation layer 31. In each unit region Ur, the areas in which the fluorescent layers 41 are formed exemplarily corresponds to the areas of the openings of the mask, and said areas can be adjusted according to the real application conditions.

Figure 5F:
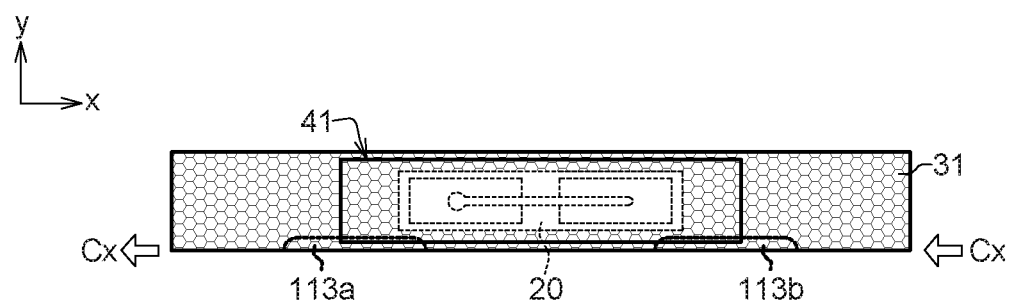

Thereafter, as shown in FIG. 5F and FIG. 6, the encapsulation layer 31, the substrate 10 and the conducting holes 1130a and 1130b are diced to form a plurality of single LEDs which are separated from each other. After dicing, the conducting holes 113a and 113b of each LED, which are parts of the original conducting holes 1130a and 1130b before dicing, have junctions extend from the first conducting portions to the second conducting portions, and the junctions are exposed on the lateral surface 104 of the substrate 10 (the lateral surface 104 connecting the upper surface 101 and the lower surface 102) and aligned with the lateral surface 104.

In the embodiment, in each unit region Ur, the two conducting holes 1130a and 1130b partially overlap the two first conducting portions 111a and 111b. As shown in FIG. 5A, FIG. 5B and FIG. 6, during dicing, portions of the conducting holes 113a and 113b that do not overlap the first conducting portions 111a and 111b are cut to form the junctions exposed on the lateral surface 104 of the substrate 10. In one embodiment, as shown in FIG. 5A, FIG. 5B and FIG. 6, the two conducting holes 1130a and 1130b of each unit region Ur each correspond to first edges 1110a and 1110b of the two first conducting portions 111a and 111b (the edges at the same side), major axes of the conducting holes 1130a and 1130b corresponding to the first conducting portions 111a and 111b are arranged along a first direction (such as x-direction), and the first direction is parallel to a cutting direction (such as the first cutting direction D1 of the cutting lines Cx as shown in FIG. 6). In one embodiment, the major axes of the conducting holes 1130a and 1130b, for example, overlap the first edges 1110a and 1110b of the first conducting portions 111a and 111b, respectively. As such, when the step of dicing the encapsulation layer 31 and the substrate 10 is conducted, the cutting lines Cx of dicing are along the first edges 1110a and 1110b, as shown in FIG. 6. Thereby, the conducting holes 113a and 113b of each LED unit after dicing may have the junctions exposed on the lateral surface 104 of the substrate 10 as shown in FIG. 1. In one embodiment, the junctions of the conducting holes 113a and 113b are perpendicular to the first conducting portions 111a and 111b and the second conducting portions 112a and 112b. Since the conducting holes 113a and 113b are formed by forming through holes using laser drilling followed by filling the conducting material into the through holes at the previous steps, the junctions of the conducting holes 113a and 113b exposed on the lateral surface 104 of the substrate 10 after dicing are full surfaces (i.e. continuous surfaces of the conducting material) and aligned with the lateral surface 104 of the substrate 10, as shown in FIG. 1.

Further, while the shapes of the through hole used for forming the conducting holes 1130a and 1130b are exemplarily illustrated as elongated cylinders in which the major axis is larger than the branch axis, the disclosure is not limited thereto. As long as the conducting holes 1130a and 1130b formed in the substrate 10 partially overlap the edges of the electrodes (such as the first conducting portions 111a and 111b) such that continuous conducting junctions exposed on the lateral surface 104 of the substrate 10 can be formed after dicing, the conducting holes 1130a and 1130b belong to the implementation of this disclosure. The shapes of the conducting holes 1130a and 1130b, such as the areas and shapes on the upper surface 101 of the substrate 10 (comprising the sizes of the major and branch axes), can be decided according to the real application conditions such as the desired junction areas, and they are not limited in the disclosure.

In one embodiment, a group of the design sizes is exemplarily as follows: the length $L_T$ of the substrate 10 before dicing is 109.2 mm, the width $W_T$ thereof is 54.5 mm (FIG. 6), and for the plurality of unit regions Ur defined on the substrate 10 and arranged as a matrix, adjacent unit regions Ur in the same column may have a pitch $W_P$ of 1.00 mm, and the shortest length Lg of two conducting holes 1130a and 1130b of adjacent unit regions Ur in the same row is 1.05 mm. The pitches for the laser drilling in x-direction and y-direction are, for example, larger than 0.95 mm. The dicing of the substrate 10 as shown in FIG. 6 is conducted with the first and second cutting lines Cx and Cy having a width of about 100 μm. Any size of the pitch Wp is applicable as long as it is in the range such that the substrate will not be broken during dicing and the exposed continuous conducting junctions of the conducting holes 113a and 113b will not be damaged. After dicing, each unit region Ur has, for example, a length of 3.0 mm (the same as L1 in FIG. 2) and a width of 0.4 mm (the same as W1 in FIG. 2). A substrate 10 having a thickness of 0.38 mm can be divided into such as 42*30=1260 edge lighting LED units after dicing. Of course, as known in the art, these values are provided for exemplary explanation only, the ranges of the disclosure are not limited thereto, and the real sizes can be appropriately modified and changed according to the application conditions.

Further, since the chip 20 is repeatedly heated and cooled during the package process, or thermal stresses may be produced at the interfaces between packaging material layers of the chip 20, which have different CTE values, during the transportation after the package process, the packaging material layers may be deformed, delaminated or broken, or even the chip may be damaged. As such, in the embodiment, for the substrate 10 for the disposition of the chip 20 and the encapsulation layer 31 covering on and directly contacting the substrate 10, the CTE value of each is preferably small, and the difference of the CTE values therebetween is also preferably small, so as to prevent improper damage of the structure caused by the thermal stress produced during the processes. In one embodiment, the substrate 10 is, for example, a ceramic substrate having a low CTE value (about 6 ppm/° C.), and the encapsulation layer 31 is, for example, a white epoxy or silicone resin having a low CTE value (the silicone resin has a low CTE value of about 14 ppm/° C.). Further, the ceramic substrate has a high bending strength, and it can protect the chip 20 from the implication of stress, and can be worked as a stress barrier layer. Further, the reflectivity of the encapsulation layer 31 (such as comprising silicone and titanium dioxide) is, for example, at least larger than 90%, such that the side light can be guided to the forward direction, and the forward light efficiency and the illuminance can be improved.

In summary, in the edge lighting LED according to the embodiments, the top surface 311 of the encapsulation layer 31 is aligned with the first surface 201 of the chip 2, as shown in FIG. 3. Besides, in a single LED structure, the substrate 10 has two first side surfaces 103 each connecting the bearing surface 101, and the encapsulation layer 31 has two second side surfaces 313 each connecting the top surface 311. After dicing the encapsulation layer 31 and the substrate 10 such that the unit dicing is completed, the two second side surfaces 313 of the encapsulation layer 31 are aligned with the two first side surfaces 103 of the substrate 10, and the junctions of the conducting holes 113a and 113b are exposed on the lateral surface 104 of the substrate 10 and aligned with the lateral surface 104 of the substrate 10. When real in use, the junctions of the conducting holes 113a and 113b exposed on the lateral surface 104 of the substrate 10 can be bounded with an external component (such as an external circuitry) to achieve electrical connection, and thereby an edge lighting source is formed. That is, the light emitting surface of the chip 20 (i.e. the first surface 201) is perpendicular to the external electrodes (i.e. the exposed junctions of the conducting holes 113a and 113b). By applying the particular design provided in the embodiments, the surface bounding areas between the external electrodes and the external component can be increased (for example, by increase the length Lc of the conducting hole 113a/113b as described above), and thereby the alignment and package efficiency when the structure is packaged with the external circuitry can be improved. In particular, when the sizes of the LED structure are very small, the design of the embodiments can significantly improve the product yield and electrical performance of a single unit structure, and the structural strength and stability when it is connected with the external component.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting diode (LED), comprising:
   a substrate having an upper surface and a lower surface positioned oppositely, and a lateral surface connecting the upper surface and the lower surface;
   an electrode pattern at least comprising:
   two first conducting portions separately disposed on the upper surface of the substrate;
   two second conducting portions separately disposed on the lower surface of the substrate; and
   two conducting holes separately penetrating through the substrate, wherein each of the conducting holes connects one of the first conducting portions and one of the second conducting portions, and the conducting holes are exposed on the lateral surface of the substrate;
   a chip having a first surface and a second surface positioned oppositely, wherein the second surface of the chip is disposed on the two first conducting portions;
   an encapsulation layer covering the upper surface of the substrate, the encapsulation layer encapsulating the chip and exposing the first surface of the chip; and
   a fluorescent layer disposed on the first surface of the chip.

2. The LED according to claim 1, wherein junctions of the conducting holes extend from the first conducting portions to the second conducting portions and are exposed on the lateral surface of the substrate, and the junctions are aligned with the lateral surface.

3. The LED according to claim 1, wherein the first surface of the chip is a light emitting surface, and an extending direction of the first surface is substantially perpendicular to an extending direction of junctions of the conducting holes.

4. The LED according to claim 1, wherein each of the conducting holes is a through hole filled with a conducting material.

5. The LED according to claim 4, wherein the conducting material comprises a metal or a composite metal comprising two or more metals.

6. The LED according to claim 4, wherein the conducting material comprises at least one of gold, silver, and copper.

7. The LED according to claim 1, wherein the substrate has two first side surfaces each connecting the upper surface and the lower surface, the encapsulation layer has two second side surfaces each connecting a top surface of the encapsulation layer, and the two second side surfaces of the encapsulation layer are aligned with the two first side surfaces of the substrate, respectively.

8. The LED according to claim 1, wherein the fluorescent layer directly contacts the first surface of the chip and at least completely covers the first surface of the chip.

9. The LED according to claim 1, wherein an area of the fluorescent layer is substantially equal to or larger than an area of the chip and smaller than an area of the top surface of the encapsulation layer.

10. The LED according to claim 1, wherein two side edges of the fluorescent layer are correspondingly between two edges of the chip and two outer edges of the first conducting portions.

* * * * *